(12) United States Patent
Chen

(10) Patent No.: US 7,588,353 B2
(45) Date of Patent: Sep. 15, 2009

(54) LENS ASSEMBLY FOR USE WITH LED LAMP

(75) Inventor: Chi Gon Chen, Guang Zhou (CN)

(73) Assignee: International Development LLC, Roanoke, TX (US)

( * ) Notice: Subject to any disclaimer, the term of this patent is extended or adjusted under 35 U.S.C. 154(b) by 0 days.

(21) Appl. No.: 12/054,057

(22) Filed: Mar. 24, 2008

(65) Prior Publication Data

US 2008/0247176 A1  Oct. 9, 2008

Related U.S. Application Data

(60) Provisional application No. 60/919,630, filed on Mar. 23, 2007.

(51) Int. Cl.
*F21V 11/00* (2006.01)
(52) U.S. Cl. .................... 362/359; 362/297
(58) Field of Classification Search .......... 362/215, 362/217.02, 217.04, 240, 241, 242, 243, 362/249.02, 255, 257, 292, 296.01, 297, 362/302, 304, 305, 307–310, 311.01, 311.02, 362/327–329, 350, 351, 356, 363, 800, 806, 362/810; 359/359, 619, 620, 623, 627, 809, 359/811, 815, 819

See application file for complete search history.

(56) References Cited

U.S. PATENT DOCUMENTS

| | | | | |
|---|---|---|---|---|
| 1,941,109 A * | 12/1933 | Rolph | .................. | 362/441 |
| 2,344,221 A * | 3/1944 | Trautner | .................. | 362/297 |
| 3,202,979 A * | 8/1965 | Lemelson | .................. | 340/321 |
| 3,253,276 A * | 5/1966 | Nagel | .................. | 340/815.76 |
| 7,175,294 B1 * | 2/2007 | Estrada et al. | .................. | 362/101 |

* cited by examiner

*Primary Examiner*—Hargobind S Sawhney
(74) *Attorney, Agent, or Firm*—David W. Carstens; Carstens & Cahoon, LLP

(57) ABSTRACT

A two-part lens assembly for use with an LED lamp fixture is disclosed. The assembly is comprised an inner portion and an outer portion. The inner portion of the assembly is a substantially clear (transparent) lens with substantially flat sides. Formed in the bottom of the inner portion is a conical shape. The conical shape acts to reflect the light emitted by the LEDs. The outer portion is also a substantially clear (transparent) lens. However, the outer portion includes an outer surface having a plurality of arcuate surfaces for creating an effective light distribution pattern for the outdoor light fixture. Also included in the outer portion is a conical surface in the bottom for the reflection of the light rays emitted from the LED.

19 Claims, 5 Drawing Sheets

LENS ASSEMBLY FOR USE WITH LED LAMP

CROSS-REFERENCE TO RELATED APPLICATION

This application claims the benefit of and priority to U.S. Provisional Patent Application No. 60/919,630 titled "Lens Assembly for Use with LED Lamp" and filed Mar. 23, 2007. the technical disclosure of which is hereby incorporated herein by reference.

FIELD OF THE INVENTION

The present invention relates generally to lenses used with light fixtures having an LED lamp as a light source and, more particularly, to a two part lens assembly configured to provide a more effective means for increasing the light output of one or more LED lamps.

DESCRIPTION OF THE RELATED ART

For many years the incandescent light bulb, which was the subject of the work by Thomas Edison, has been the primary vehicle by which electrical energy is turned into light energy. While effective in producing light, it is well known that an incandescent light bulb is inefficient. Only about five percent of the electrical energy used by an incandescent light bulb is turned into light. The remaining ninety-five percent of the energy used by an incandescent light bulb is turned into heat. The heat is dissipated into the atmosphere and is effectively not used.

Because of the continuing growth of the use of electrical energy both in the U.S. and around the world and the continuing emphasis on the reduction of resources needed to produce needed levels electrical energy, recent history reveals an emphasis on finding products which provide the light output of prior are devices but use much less electrical energy. A relatively recent product is the light emitting diode or LED. Originally used to act as an indicator of the presence of an electrical signal because of its low level of light output, currently available LED's have evolved so that a higher level of illumination or output of light energy is obtained. Despite these dramatic improvements in the light output of LED's, the light output of an LED measured in watts has not attained the light output of an incandescent light. Further, the nature of the lens construction of an LED spreads light rays onto a broad array further hampering the ability of a typical LED to be used as an illumination device.

Accordingly, a need remains in the art to provide a system by which the light output of an LED may be better used for providing illumination.

BRIEF SUMMARY OF THE INVENTION

The presently disclosed invention is a system for controlling the light output of an LED so that the light output of the LED may be used for effective illumination.

According to preferred embodiment of the invention, the system and method of the present invention is shown in FIG. 1 according to its use in an outdoor lighting fixture assembly 100 such as those typically used to line walkways or outline flower beds around residences. Typically such lighting fixture assemblies 100 include a solar panel assembly (not shown) which converts light energy from the sun's rays into electrical energy and then stores the electrical energy until needed—particularly during the evening hours.

In FIG. 2 and in FIG. 5 it may be seen that the system of the present invention is embodied in a two part assembly. The inner portion 20 is a substantially clear (transparent) lens with substantially flat sides as shown in FIG. 3. Formed in the bottom 22 of the inner portion is a conical shape 24. The conical shape 24 acts to reflect the light emitted by the LED. The outer portion 30 shown in FIG. 4 is also a substantially clear (transparent) lens. However, the outer portion 30 includes an outer surface having a plurality of arcuate surfaces 32 for creating an effective light distribution pattern for the outdoor light fixture. Also included in the outer portion is a conical portion 34 in the bottom 36 for the reflection of the light rays emitted from the LED.

When the inner portion 20 and the outer portion 30 are assembled and placed over an LED in a light fixture 100, such as the one shown in dashed lines in FIG. 1, the light rays from the LED are both reflected within the assembly 10 of the inner portion 20 and outer portion 30 and directed into a usable pattern by the combination of the inner portion 20 and outer portion 30 of the present invention 10.

BRIEF DESCRIPTION OF THE SEVERAL VIEWS OF THE DRAWINGS

A more complete understanding of the lens assembly of the present invention may be had by reference to the following detailed description when taken in conjunction with the accompanying drawings, wherein.

Figure 1:
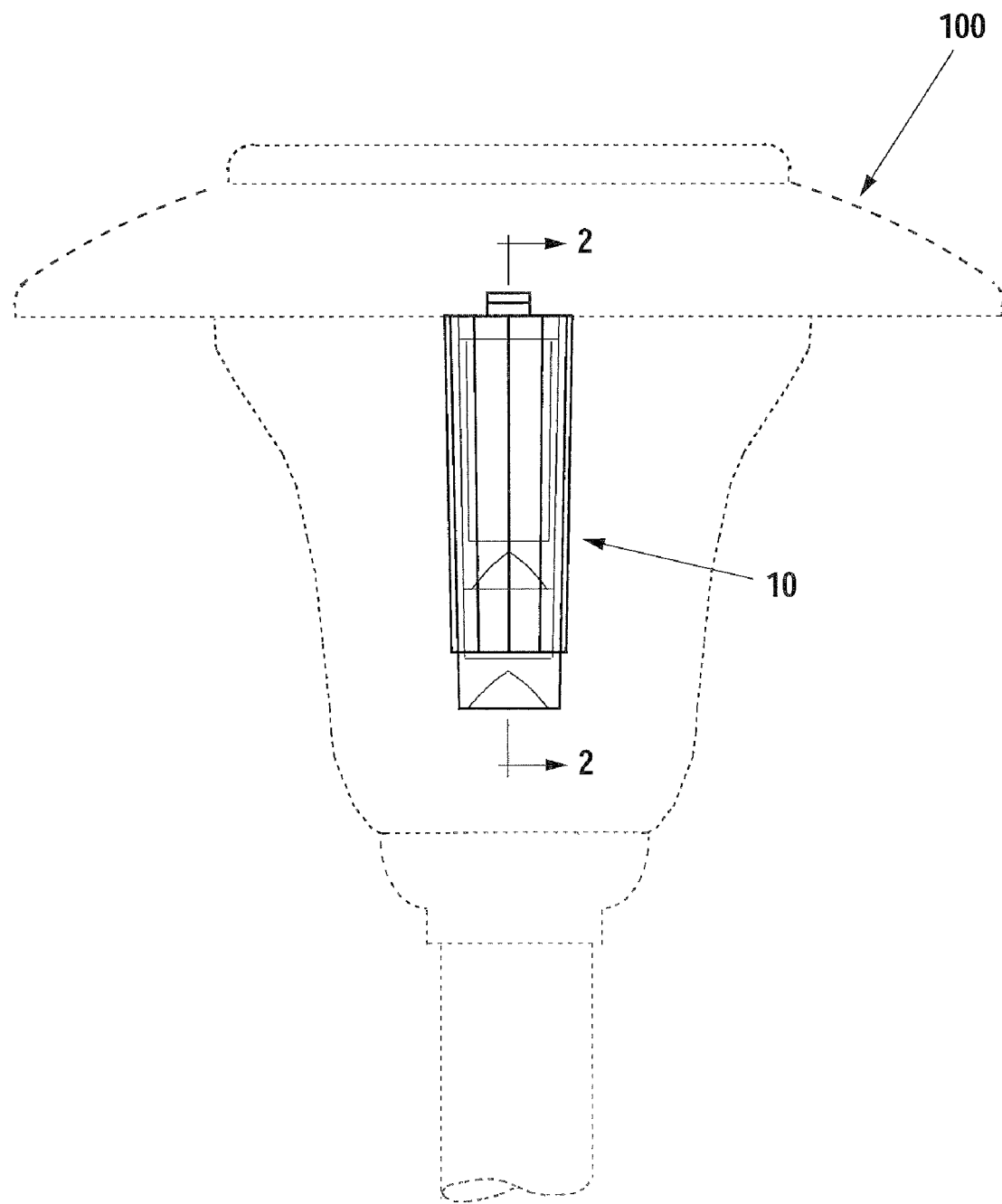
FIG. 1 is a side view of a preferred embodiment of the lens assembly of the present invention as it resides within a light fixture assembly.
Figure 4:
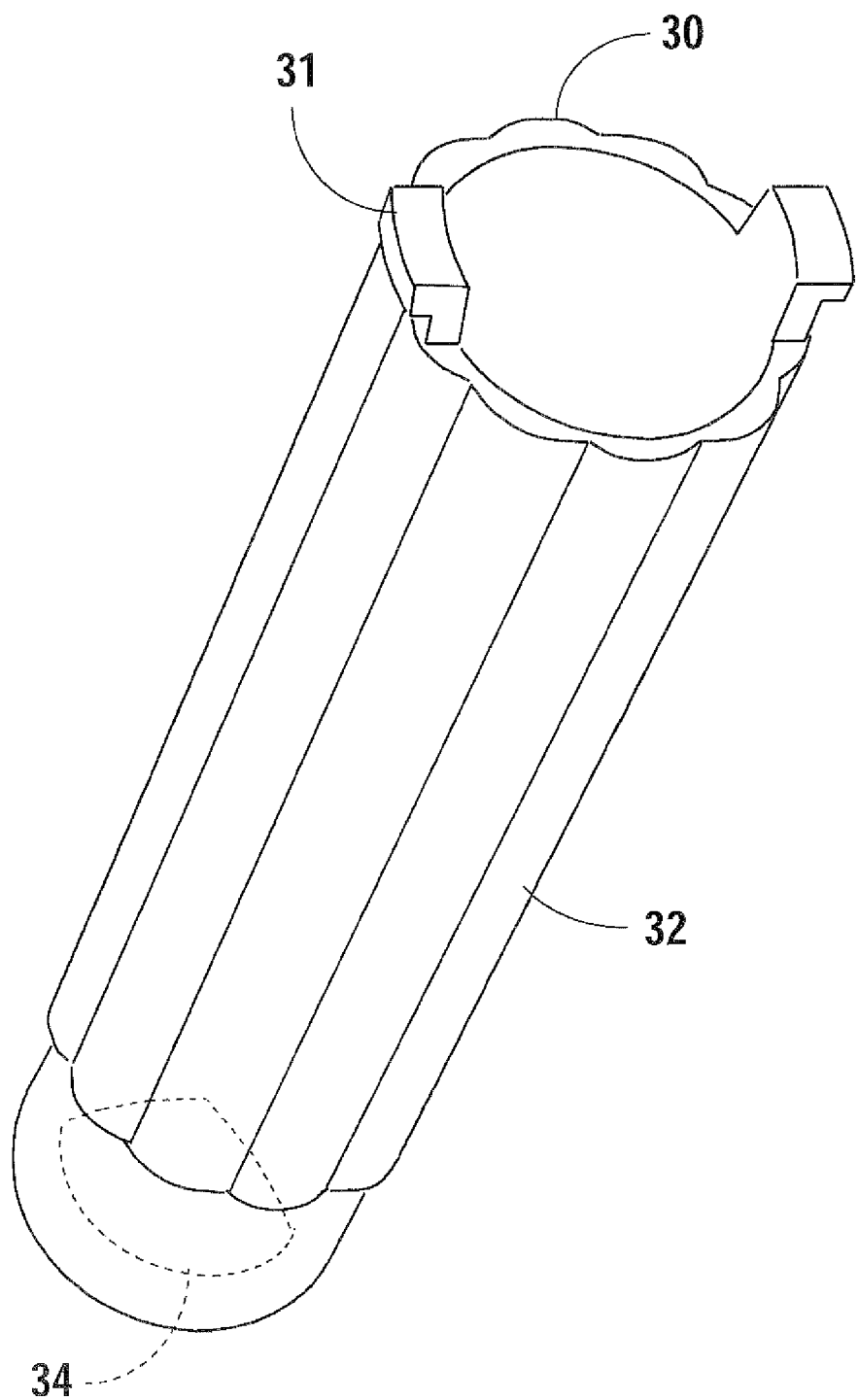
FIG. 4 is a perspective view of the outer portion of the lens assembly as shown in FIG. 2.

The broken line showing of environment in FIG. 1 is included for the purposes of illustrating only and forms no part of the claimed invention. The broken line shown in FIG. 4 shows the conical shaped surface as seen through the outer surface of the outer portion. Where used in the various figures of the drawing, the same numerals designate the same or similar parts. Furthermore, when the terms "top," "bottom," "first," "second," "upper," "lower," "height," "width," "length," "end," "side," "horizontal," "vertical," and similar terms are used herein, it should be understood that these terms have reference only to the structure shown in the drawing and are utilized only to facilitate describing the invention.

All figures are drawn for ease of explanation of the basic teachings of the present invention only; the extensions of the figures with respect to number, position, relationship, and dimensions of the parts to form the preferred embodiment will be explained or will be within the skill of the art after the following teachings of the present invention have been read and understood. Further, the exact dimensions and dimensional proportions to conform to specific magnification, weight, length, and similar requirements will likewise be within the skill of the art after the following teachings of the present invention have been read and understood.

Preferred embodiments of the lens assembly according to the present invention will now be described in detail with reference to the accompanying drawings.

DETAILED DESCRIPTION OF THE INVENTION

Referring to FIG. 1, a side view of the lens assembly 10 of a preferred embodiment of the present invention as it appears when attached to an outdoor light fixture housing 100. The lens assembly 10 is configured to cover one or more LED lamps (not shown) that are connected to the fixture 100. The lens assembly 10 acts to effectively increase the amount of useable light output that would ordinarily be produced by the LED lamps when used in conjunction with prior art fixtures and lenses, or with no structure covering the LED lamps at all. The lens assembly of the present invention performs the aforementioned function by utilizing a two part lens assembly as described further below.

Figure 2:
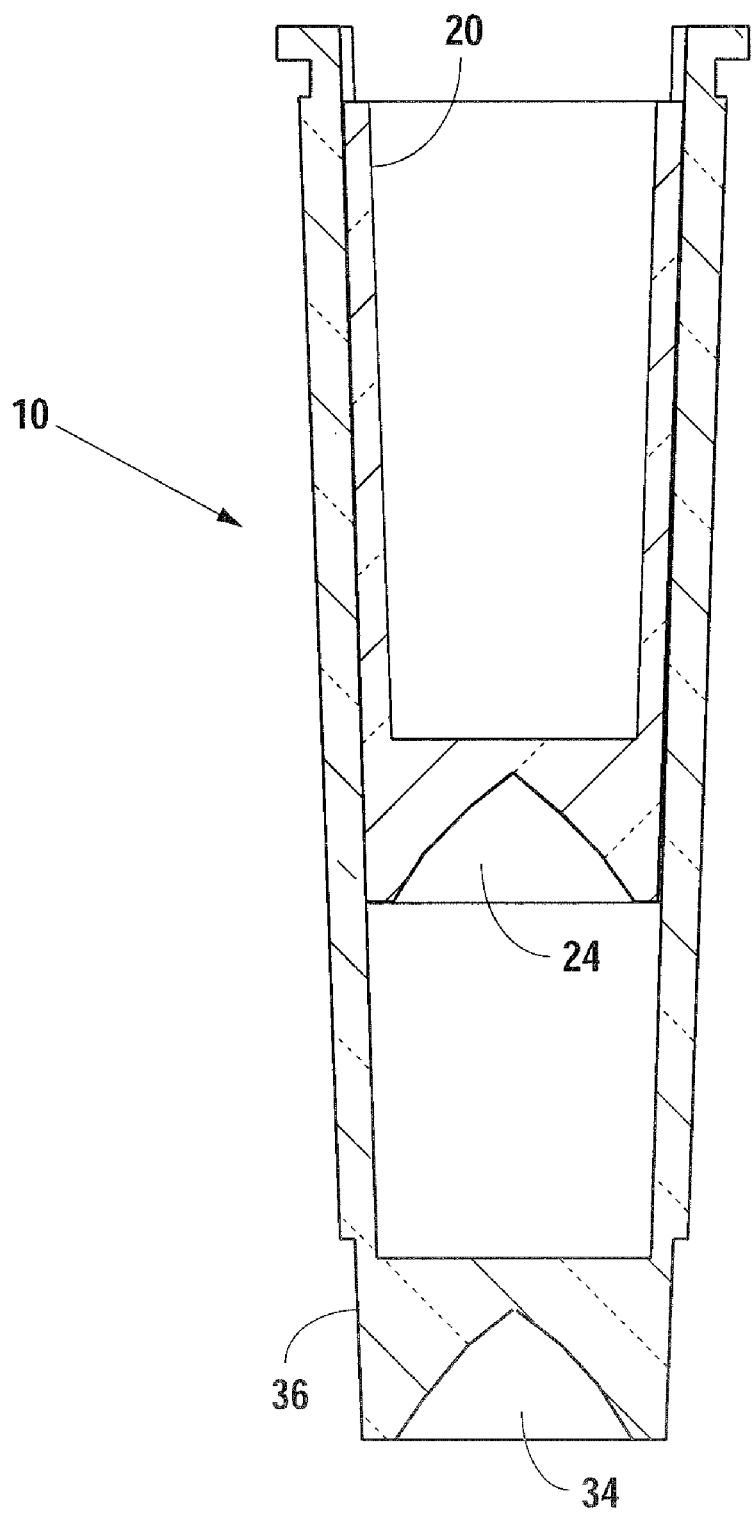
FIG. 2 is a cross-sectional view taken from line 2-2 in FIG. 1, showing the inner and outer portions of the lens assembly of a preferred embodiment of the invention.

Referring now to FIG. 2, a cross-sectional view taken from line 2-2 in FIG. 1, showing the lens assembly of a preferred embodiment of the present invention. The lens assembly 10 is comprised of an inner portion 20 and an outer portion 30. Both the inner portion 20 and the outer portion 30 of the presently preferred embodiment are substantially cylindrical and hollow, each having a top end that is open, and a bottom end that is closed. As can be clearly seen with reference to FIG. 2, the diameter of both the outer portion 30 and the inner portion 20 of the lens assembly 10 gradually decreases (tapers) from the top end to the bottom end. However, alternate embodiments of the inner and outer portion may be configured without tapering sides. Further, the diameter of the inner portion 20 is configured to be slightly less than that of the outer portion 30, thus permitting the inner portion 20 to nest within the outer portion 30.

Still referring to FIG. 2, it is important to note that the inner portion 20 and the outer portion 30 of the presently preferred embodiment of the lens assembly 10 are permanently affixed to one another during the assembly process, it is contemplated that alternate embodiments of the inner and outer portions may be detachably secured to one another, allowing the user of the invention to easily separate the two portions for cleaning, repair, or other purposes. Both the inner portion and the outer portion of the lens assembly are substantially transparent, i.e., allowing light to transmit through their respective surfaces with only a small loss of light throughput. As will be appreciated by those of ordinary skill in the art, it is contemplated that the inner portion and outer portion may be constructed of glass, polymer, or any other material capable of achieving the functions of the lens assembly as described herein.

The inner surface of each of the sides of the inner portion and outer portion of the lens assembly as shown in FIG. 2, are substantially flat. However, note that alternate embodiments of the outer portion may include sides having an inner surface with a plurality of arcuate surfaces (not shown). The outer surface of the bottom end of both the inner portion 24 and outer portion 34 of the lens assembly are conical in shape, allowing for the effective reflection of light and thus, increasing the overall output of useable light emitted from the LED lamps.

Figure 3:
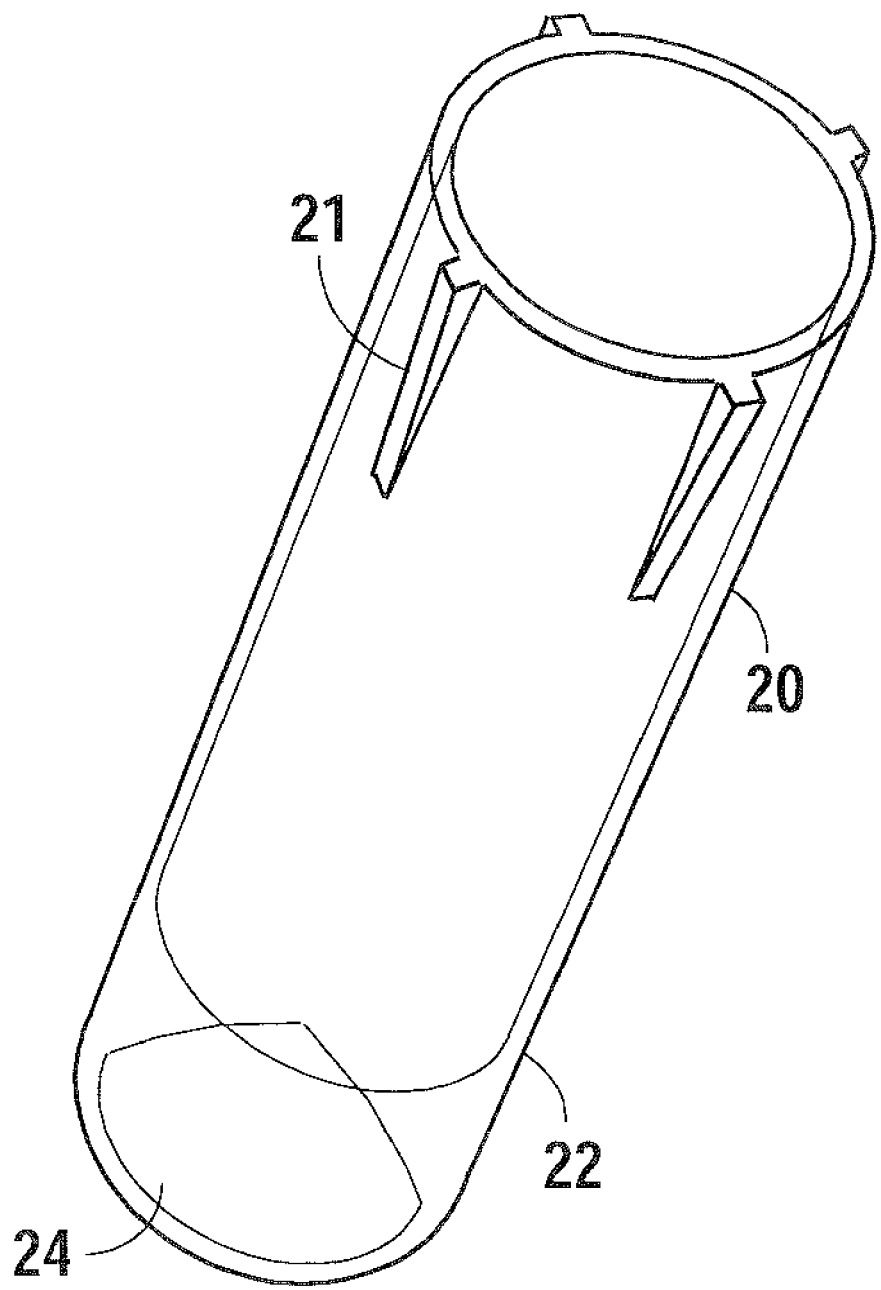
FIG. 3 is a perspective view of the inner portion of the lens assembly as shown in FIG. 2.

Referring now to FIG. 3, a perspective view of the inner portion 20 of the lens assembly shown 10 in FIG. 2, a plurality of wedges 21 are formed on the outer surface thereof to serve as a means for supporting the inner portion within the outer portion. Alternate embodiments of the present invention may utilize the aforementioned tapered wedges 21, the shapes of the portions themselves, a combination of the foregoing structures and shapes, or any other structure or shape that may serve as a means for supporting the inner portion within the outer portion.

Referring now to FIG. 4, a perspective view of the outer portion of the lens assembly shown in FIG. 2, the outer surface thereof has a plurality of substantially transparent arcuate surfaces 32 formed around the sides of at least part of said outer portion 30 of the assembly. The aforementioned arcuate surfaces act to more effectively distribute light from the LED lamps, allowing for the output of an increased amount of useable light. Unlike prior art lens assemblies, the arcuate surfaces 32 found on the outer portion of the present invention permit light emitted from the LED lamp to be more effectively radiated outward onto walking surfaces and other desirable surfaces the user intends to be illuminated.

Still referring to FIG. 4, outwardly extending flange segments 31 are integrally attached to the top end of the presently preferred embodiment of the outer portion, providing a means for detachably securing the lens assembly to light fixture. The flange segments 31, configured to mate with a correspondingly shaped slot or similar structure (not shown) formed on the light fixture permit a user of the present invention to remove the lens assembly from a fixture by rotating the lens assembly. The lens assembly may be similarly attached to a light fixture configured for mating with the lens assembly by such a rotating action. While the presently preferred embodiment is configured to utilize the foregoing means for attachment of the lens assembly to a fixture, any other means for attaching the lens assembly to a fixture, detachably or non-detachably, are contemplated and may be implemented with respect to alternate embodiments as will be appreciated by those of ordinary skill in the art.

Figure 5:
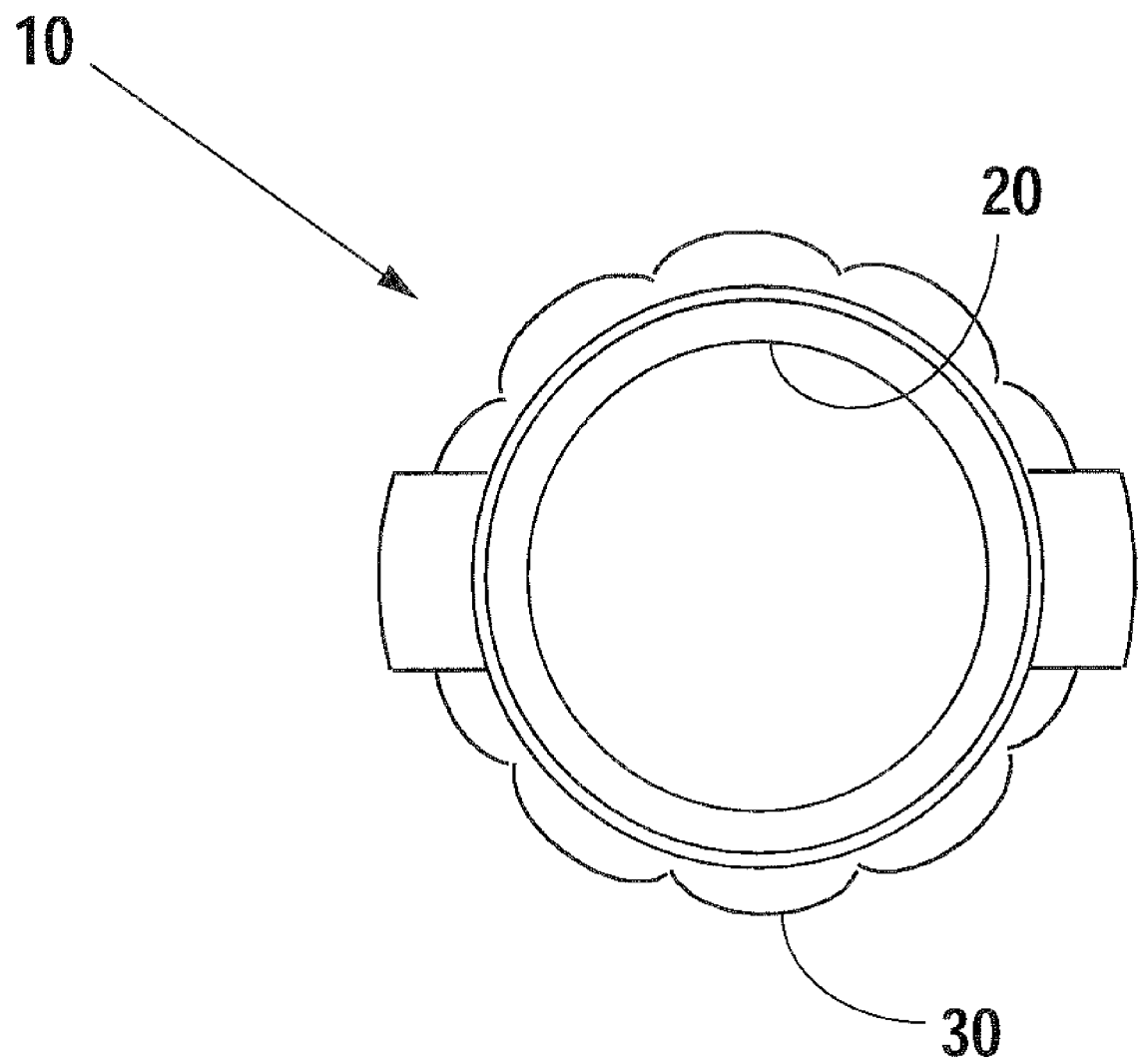
FIG. 5 is a top view of the lens assembly as shown in FIG. 2.

Now referring to FIG. 5, a top view of the lens assembly shown in FIG. 2, the inner portion of the lens assembly is nested within the outer portion of the lens assembly. The arcuate surfaces 32 found on the outer portion of the lens assembly act to direct the light emitted from the LED lamps in a more effective pattern than seen in prior art spherical lenses. Further, the simplified configuration of the present invention provides benefits not seen in prior art lens assemblies in that the present invention is easy to assemble, manufacture, and is more durable than other spherical assemblies as the substantially cylindrical shape of the present invention is less susceptible to accidental breakage. However, it is contemplated that alternate embodiments of the lens assembly of the present invention may be configured in a variety of other shapes, other than substantially cylindrical, having equally durable forms.

It will now be evident to those skilled in the art that there has been described herein a lens assembly that is capable of effectively increasing the amount of light output of a light source such as an LED lamp. Although the invention disclosed herein has been described by way of a preferred embodiment, it will be evident that other adaptations and modifications can be employed without departing from the spirit and scope thereof. The terms and expressions employed herein have been used as terms of description and not of limitation; and thus, there is no intent of excluding equivalents, but on the contrary it is intended to cover any and all equivalents that may be employed without departing from the spirit and scope of the invention. Accordingly, the protection sought herein is as set forth in the claims below.

I claim:

1. A lens assembly comprising:
  a hollow inner portion having a first conical surface formed in a first bottom end thereof; and
  a hollow outer portion having a plurality of arcuate reflective surfaces formed therearound, said outer portion constructed and arranged to surround said inner tubular portion; said outer portion having a second conical surface formed in a second bottom end thereof.

2. The lens assembly of claim 1 wherein said inner portion is substantially transparent.

3. The lens assembly of claim 2 wherein said outer portion is substantially transparent.

4. The lens assembly of claim 3 wherein said outer portion has one or more outwardly extending flange segments adapted for detachably securing said lens assembly to a structure adapted to mate with said segments.

5. The lens assembly of claim 4 wherein said inner portion is detachably secured to said outer portion.

6. The lens assembly of claim 4 wherein said inner portion is permanently secured to said outer portion.

7. The lens assembly of claim 5 wherein said lens assembly is constructed of a polymer material.

8. The lens assembly of claim 5 wherein said lens assembly is constructed of glass.

9. The lens assembly of claim 7 wherein said inner portion and said outer portion are substantially cylindrical.

10. The lens assembly of claim 9 wherein the shapes of said inner portion and outer portion are formed such that said inner portion is capable of being supported within said outer portion.

11. The lens assembly of claim 9 wherein one or more wedges are attached to an outer surface of the inner portion for supporting said inner portion within said outer portion.

12. A lens assembly through which one or more LED lamps will output light comprising:

a substantially cylindrical hollow inner portion having a first open top end and a first closed bottom end; said inner portion being substantially transparent and having a substantially conical surface formed at said first closed bottom end; and a substantially cylindrical hollow outer portion having a first open top end for receiving said inner portion, and a first closed bottom end; said outer portion being substantially transparent and having a substantially conical surface formed at said first closed bottom end; said outer portion having a plurality of arcuate surfaces formed therearound an outer surface of said outer portion, wherein said light is transmitted from said LED lamps and reflected within said assembly by said conical surfaces and directed outward from said assembly by said arcuate surfaces.

13. The lens assembly of claim 12 wherein said outer portion has one or more outwardly extending flange segments adapted for detachably securing said lens assembly to a structure adapted to mate with said segments.

14. The lens assembly of claim 13 wherein said inner portion is detachably secured to said outer portion.

15. The lens assembly of claim 13 wherein said inner portion is permanently secured to said outer portion.

16. The lens assembly of claim 14 wherein said lens assembly is constructed of a polymer material.

17. The lens assembly of claim 14 wherein said lens assembly is constructed of glass.

18. The lens assembly of claim 16 wherein the shapes of said inner portion and outer portion are formed such that said inner portion is capable of being supported within said outer portion.

19. The lens assembly of claim 16 wherein one or more wedges are attached to an outer surface of the inner portion for supporting said inner portion within said outer portion.

* * * * *